United States Patent
Wang et al.

(10) Patent No.: US 7,634,037 B2
(45) Date of Patent: Dec. 15, 2009

(54) DIGITAL PHASE-LOCKED LOOP CIRCUIT AND A METHOD THEREOF

(75) Inventors: Chua-Chin Wang, Kaohsiung (TW); Ming-Kai Chang, Kaohsiung (TW); Ling-Shiou Huang, Hsinhua (TW)

(73) Assignees: National Sun Yat-Sen University (TW); Himax Technologies Limited (TW)

( * ) Notice: Subject to any disclaimer, the term of this patent is extended or adjusted under 35 U.S.C. 154(b) by 596 days.

(21) Appl. No.: 11/179,847

(22) Filed: Jul. 12, 2005

(65) Prior Publication Data

US 2006/0146972 A1 Jul. 6, 2006

(30) Foreign Application Priority Data

Jan. 6, 2005 (TW) .............................. 94100399 A

(51) Int. Cl.
*H03D 3/24* (2006.01)
*H04L 7/00* (2006.01)

(52) U.S. Cl. ...................................... 375/376; 375/354

(58) Field of Classification Search ................. 375/376, 375/373, 371, 354; 329/307
See application file for complete search history.

(56) References Cited

U.S. PATENT DOCUMENTS

| | | | | |
|---|---|---|---|---|
| 5,896,428 | A | * | 4/1999 | Yanagiuchi .................. 375/374 |
| 6,034,735 | A | | 3/2000 | Senbongi et al. |
| 6,043,694 | A | * | 3/2000 | Dortu ......................... 327/156 |
| 6,310,653 | B1 | | 10/2001 | Malcolm, Jr. et al. |
| 6,538,702 | B1 | | 3/2003 | Taketani et al. |
| 6,741,289 | B1 | | 5/2004 | Bicacki |
| 2003/0053564 | A1 | * | 3/2003 | Kim et al. .................... 375/326 |
| 2005/0226429 | A1 | * | 10/2005 | Hollowbush et al. .......... 381/56 |

FOREIGN PATENT DOCUMENTS

TW 373389 8/1998

* cited by examiner

*Primary Examiner*—Shuwang Liu
*Assistant Examiner*—Brian J Stevens
(74) *Attorney, Agent, or Firm*—The Webb Law Firm

(57) ABSTRACT

A method and a circuit for resolving the out-of-phase problem between a color burst signal and a sub-carrier signal of a television system. A delay means is used which leads to the synchronization of the color burst signal and the sub-carrier signal such that a subsequent color demodulator can demodulate correct color signals. Therefore, the locking of the two signals will be fastened without any excessively large circuit hardware.

12 Claims, 5 Drawing Sheets

DIGITAL PHASE-LOCKED LOOP CIRCUIT AND A METHOD THEREOF

RELATED APPLICATIONS

The present application is based on, and claims priority from, Taiwan Application Serial Number 94100399, filed Jan. 6, 2005, the disclosure of which is hereby incorporated by reference herein in its entirety.

BACKGROUND

1. Field of Invention

The present invention relates to a color television system. More particularly, the present invention relates to an apparatus and method for producing sub-carrier signals.

2. Description of Related Art

Receivers for different television systems, such as the digital color signal reproducing circuits often used in NTSC and PAL television systems, have become widely used with the popularity of televisions and offered increasingly better performance, as technology progresses. FIG. 1 is a schematic view of a conventional digital phase-locked loop (PLL) circuit, which is applicable to NTSC/PAL/SECAM television systems. The function of the digital phase-locked loop circuit 100 is to generate sub-carrier signals for a subsequent color demodulator according to the inputted color burst signals.

As illustrated in FIG. 1, a phase detector (PD) 102 compares phases of the color burst signal and the sub-carrier signal to generate a phase shift signal. A loop filter 104 filters the phase shift signal, and then the filtered phase shift signal is inputted into a digital control oscillator (DCO) 106.

The digital control oscillator 106 generates the sub-carrier signals according to the filtered phase shift signal and feeds back the generated sub-carrier signals to the phase detector 102. With the feedback procedure, the digital phase-locked loop circuit 100 can generate the sub-carrier signals of the same oscillation frequency with that of the color burst signals and lock the phases of the color burst signals and the sub-carrier signals such that there is no phase shift between the two signals.

However, in the conventional digital phase-locked loop circuit 100, the phase detector 102 may lock the phases of the color burst signal and the sub-carrier signal erroneously at 180 degrees instead of at the correct 0 degree when the phase shift between the two signals is over 90 degrees. FIG. 2 is a schematic diagram of the opposite phase locking of the color burst signal and the sub-carrier signal. As illustrated in FIG. 2, the foregoing condition causes the color burst signal 202 (solid line) and the sub-carrier signal 204 (dashed line) to be locked in the undesirably opposite phases when they are of steady states, and thus the subsequent color demodulator cannot obtain correct colors by reference.

The prior art provides several different methods or apparatuses to solve the problem of erroneous phase locking. For example, Taiwan Patent No. 373,389, "A video input apparatus for connecting to a computer and the method thereof", disclosed an apparatus and method using table lookup to solve the erroneous phase locking. U.S. Pat. No. 6,741,289, "Technique to stabilize the chrominance subcarrier generation in a line-locked digital video system", and No. 6,310,653, "Phase comparison and phase adjustment for synchronization to a reference signal that is asynchronous with respect to a digital sampling clock", both solve the problem with very complicated circuits.

Other conventional techniques, such as U.S. Pat. No. 6,538,702, "Digital color signal reproducing circuit", and No. 6,034,735, "Clock generator for digital video signal processing apparatus", solve the problem by phase compensating, but they still require large circuits and cannot easily complete the phase locking within a short time.

SUMMARY

It is therefore an aspect of the present invention to provide a digital phase-locked loop circuit, which is simple and is able to lock the phases of a digital input signal and a digital output signal within a short time.

It is another aspect of the present invention to provide a digital phase-locked loop circuit for a TV signal decoder in order to solve the erroneous phase locking of the conventional digital phase-locked loop circuit.

According to one preferred embodiment of the present invention, the digital phase-locked loop circuit comprises a phase detector, a loop filter, a digital control oscillator, a value detector and a phase delay comparator. The phase detector compares phases of a digital input signal and a digital output signal to generate a phase shift signal. The loop filter digitally filters the phase shift signal. The digital control oscillator generates the digital output signal according to the filtered phase shift signal.

The value detector detects the digital output signal and outputs a peak value or a trough value of the digital output signal. The phase delay comparator receives the digital input signal and the peak value or the trough value of the digital output value and determines whether or not the most significant bit of the peak value or the trough value is identical to the most significant bit of the digital input signal simultaneously inputted into the phase delay comparator. When the most significant bit of the peak value or the trough value is different from the most significant bit of the digital input signal simultaneously inputted into the phase delay comparator, the phase delay comparator changes the phase of the digital input signal inputted into the phase detector.

It is another aspect of the present invention to provide a TV signal phase-locking method in order to settle the conventional problem that the color burst signal and the sub-carrier signal are locked in undesirably opposite phases when they are of steady states.

According to another preferred embodiment of the present invention, the TV signal phase-locking method is used for locking phases of a digital input signal and a digital output signal. The digital input signal is a digital sine wave, and the digital output signal is reproduced according to the digital input signal. The digital output signal is detected and a peak value or a trough value of the digital output signal is outputted. Whether or not the most significant bit of the peak value or the trough value is identical to the most significant bit of the simultaneously inputted digital input signal is determined. The phase of the digital input signal is changed when the most significant bit of the peak value or the trough value is different from the most significant bit of the simultaneously inputted digital input signal.

The digital phase-locked loop circuit and the method thereof have simple circuit structures, are suitable for NTSC/PAL/SECAM television systems, and can quickly synchronize the digital input signal and the digital output signal to have the same phase so that the subsequent color demodulator can demodulate the correct colors.

It is to be understood that both the foregoing general description and the following detailed description are examples and are intended to provide further explanation of the invention as claimed.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

Figure 1:
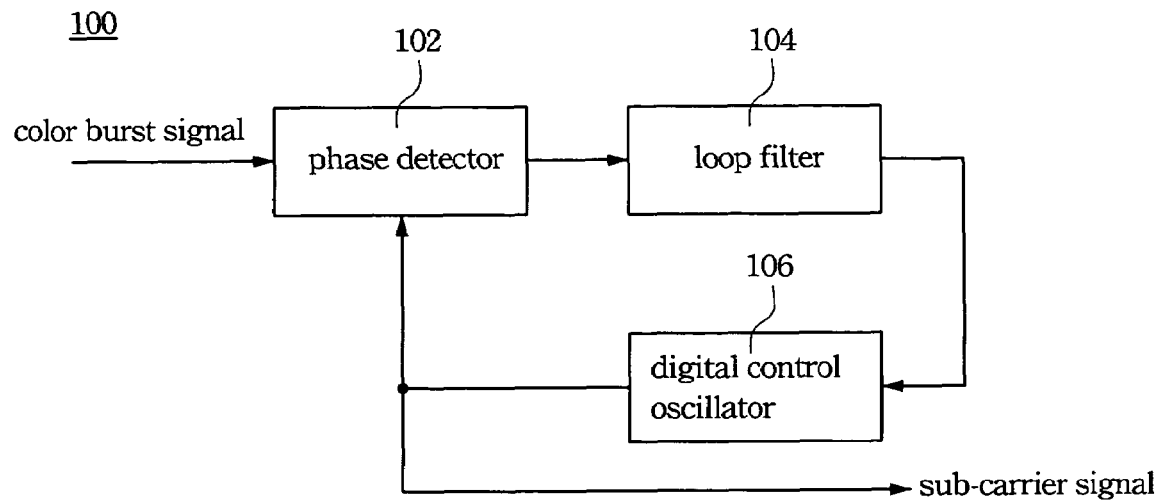
FIG. 1 is a schematic view of a conventional digital phase-locked loop (PLL) circuit.

Reference will now be made in detail to the present preferred embodiments of the invention, examples of which are illustrated in the accompanying drawings. Wherever possible, the same reference numbers are used in the drawings and the description to refer to the same or like parts.

Figure 3:
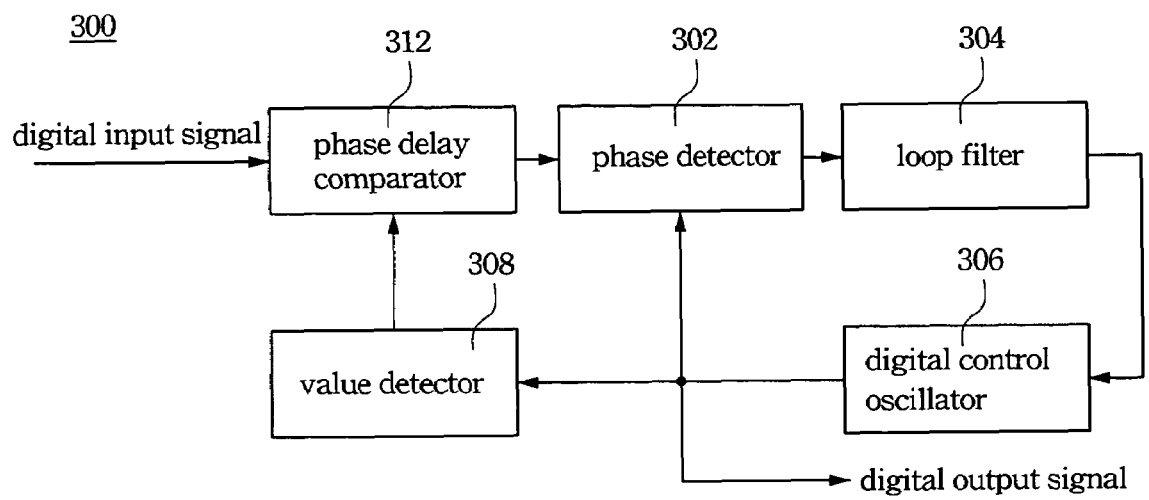
FIG. 3 is a circuit functional block diagram of one preferred embodiment of the present invention.

FIG. 3 is a circuit functional block diagram of one preferred embodiment of the present invention. A digital phase-locked loop circuit 300 comprises a phase detector 302, a loop filter 304, a digital control oscillator 306, a value detector 308 and a phase delay comparator 312. The phase detector 302 compares phases of a digital input signal and a digital output signal to generate a phase shift signal. The loop filter 304 digitally filters the phase shift signal. The digital control oscillator 306 generates the digital output signal according to the filtered phase shift signal.

The value detector 308 detects the digital output signal and outputs a peak value or a trough value of the digital output signal. The phase delay comparator 312 receives the digital input signal and the peak value or the trough value of the digital output value outputted from the value detector 308 and determines whether or not the most significant bit (MSB) of the peak value or the trough value is identical to the most significant bit of the digital input signal simultaneously inputted into the phase delay comparator 312. When the most significant bit of the peak value or the trough value is different from the most significant bit of the simultaneously inputted digital input signal, the phase delay comparator 312 changes the phase of the digital input signal inputted into the phase detector 302.

Figure 4A:
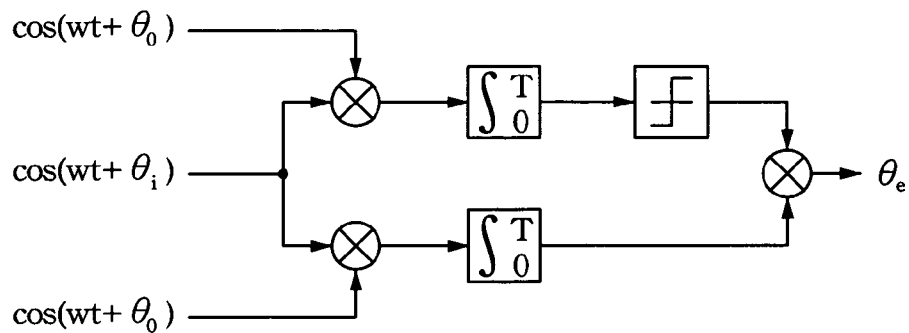
FIG. 4A is a schematic diagram of the operation of the phase detector in the preferred embodiment.

FIG. 4A is a schematic diagram of the operation of the phase detector 302 in the preferred embodiment. As illustrated in FIG. 4A, the phase detector 302 derives a phase shift between the digital input signal and the digital output signal according to the following equation (1):

$$\theta_e = \theta_i - \theta_o \quad (1)$$

$$= \left\{ \int [\sin(\omega t + \theta_o)\cos(\omega t + \theta_i)] \right\} \cdot \text{sign} \left\{ \int [\cos(\omega t + \theta_o)\cos(\omega t + \theta_i)] \right\}$$

-continued $$= \pm \sin\theta_e \cdot \text{sign}(\pm \cos\theta_e)$$

$$\approx \theta_e$$

In the equation (1), $\theta_i$ represents the phase of the digital input signal, $\theta_o$ represents the phase of the digital output signal, and $\theta_e$ represents the phase shift between the digital input signal and the digital output signal. The phase shift signal derived by the equation (1) is an approximate value. The digital control oscillator 306 corrects and generates the digital output signal, which has no phase shift with the digital input signal according to the phase shift signal.

However, because the equation (1) in reality involves both positive and negative signs, there are conditions such as two positives resulting in a positive and two negatives resulting in a positive. These conditions may cause the phase detector 302 to be unable to correctly determine whether the digital input signal and the digital input signal are of the same phase or of opposite phases when they are of steady states.

Accordingly, the preferred embodiment firstly detects whether or not the digital input signal and the digital output signal are of opposite phases. If the two signals are of opposite phases, a step of delaying the digital input signal is implemented to synchronize the digital input signal and the digital output signal such that the two signals have the same phase.

Figure 4B:
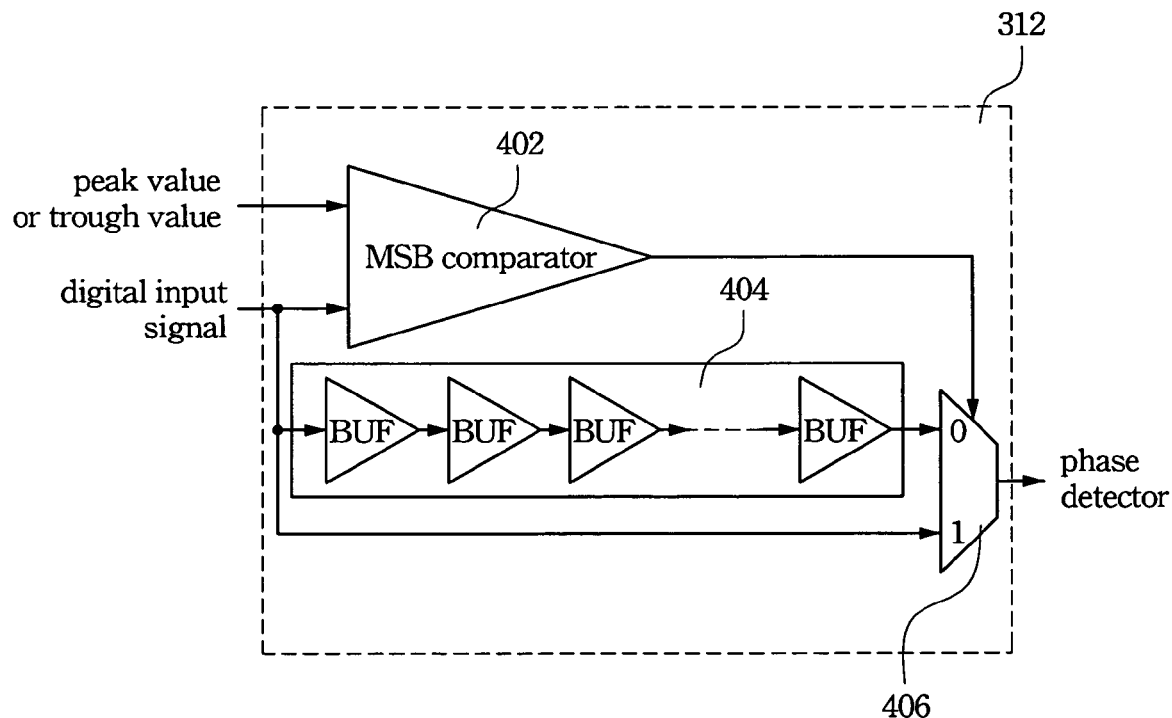
FIG. 4B is a circuit functional block diagram of the phase delay comparator of the preferred embodiment.

FIG. 4B is a circuit functional block diagram of the phase delay comparator 312 of the preferred embodiment. Generally, a sign of a digital signal can be represented by its sign bit, and usually the sign bit is exactly its most significant bit (MSB). That is, whether the signs of the two digital signals are the same or not can be derived from comparing whether the most significant bits of the two digital signals are the same or not, thus determining the two digital signals are of the same phase or of the opposite phases.

As illustrated in FIG. 4B, the phase delay comparator 312, which has both the functions of comparing and delaying the signal phase, comprises a most significant bit comparator 402, a delay 404 and a multiplexer 406. The most significant bit comparator 402 determines whether or not the most significant bit of the peak value or the trough value is identical to the most significant bit of the digital input signal simultaneously inputted into the phase delay comparator 312. It is noted that, in practice, the phase delay comparator 312 determines only one of the peak value and the trough value and does not need to have the ability to determine the two values at the same time.

The most significant bit comparator 402 outputs "0" to indicate that the digital input signal and the digital output signal are of the opposite phases. The output "0" is then sent to the multiplexer 406 for transmitting a delayed digital input signal, which is delayed by the delay 404, to the phase detector 302 by the multiplexer 406, thus achieving the result of phase delay. Moreover, the most significant bit comparator 402 retains its output at "0" after the first determination until a new determination of the next frame.

In another aspect, the most significant bit comparator 402 outputs "1" to indicate that the digital input signal and the digital output signal are of the same phase. The output "1" is then sent to the multiplexer 406 for transmitting the digital input signal to the phase detector 302. Moreover, the most significant bit comparator 402 retains its output at "1" after the first determination until a new determination of the next frame.

The delay 404 preferably comprises a plurality of buffers (BUF) electrically connected in series for delaying the phase of the digital input signal. Moreover, according to other preferred embodiments of the present invention, if the digital output signal and the digital input signal do not use their most significant bit to represent their signs, a sign bit comparator can be used to replace the foregoing most significant bit 402. More precisely, by the sign bit, the phase delay comparator in this case compares whether or not the phase of the peak value or the trough value of the digital output signal is identical to the phase of the digital input signal simultaneously inputted into the phase delay comparator.

According to one preferred embodiment of the present invention, the digital phase-locked loop circuit 300 is used in a TV signal decoder, where the digital input signal is a color burst signal, and the digital output signal is a sub-carrier signal. The color burst signal and the sub-carrier signal have the same oscillation period, and each oscillation period has N sampling points. Moreover, the quantity N of the sampling points is determined by an oscillation frequency of the digital input signal and a sampling frequency. When the most significant bit of the peak value or the trough value is different from the most significant bit of the digital input signal simultaneously inputted into the phase delay comparator, the phase delay comparator 312 delays the digital input signal by [N/2] or [N/2]+1 sampling points. The symbol [ ] is a representation of the floor function or Gauss function, whose value is obtained from rounding down to the nearest integer; e.g., [3.4] is 3 and [4.6] is 4.

For example, when the oscillation frequency of the color burst signal is 3.58 MHz, and the sampling frequency is 54 MHz, the oscillation period of the color burst signal consists of 15 sampling points, and each sampling point represents 24 degrees. When the phases of the color burst signal and the peak value or the trough value of the sub-carrier signal are different, i.e. the color burst signal and the sub-carrier signal are locked in the opposite phases, the phase delay comparator 312 delays the color burst signal by 7 or 8 sampling points. Therefore, the color burst signal is equivalently delayed by 168 degrees (7 sampling points) or 192 degrees (8 sampling points), so as to make the delayed color burst signal and sub-carrier signal have a phase shift of only 12 degrees and further be of the same phase.

Figure 5:
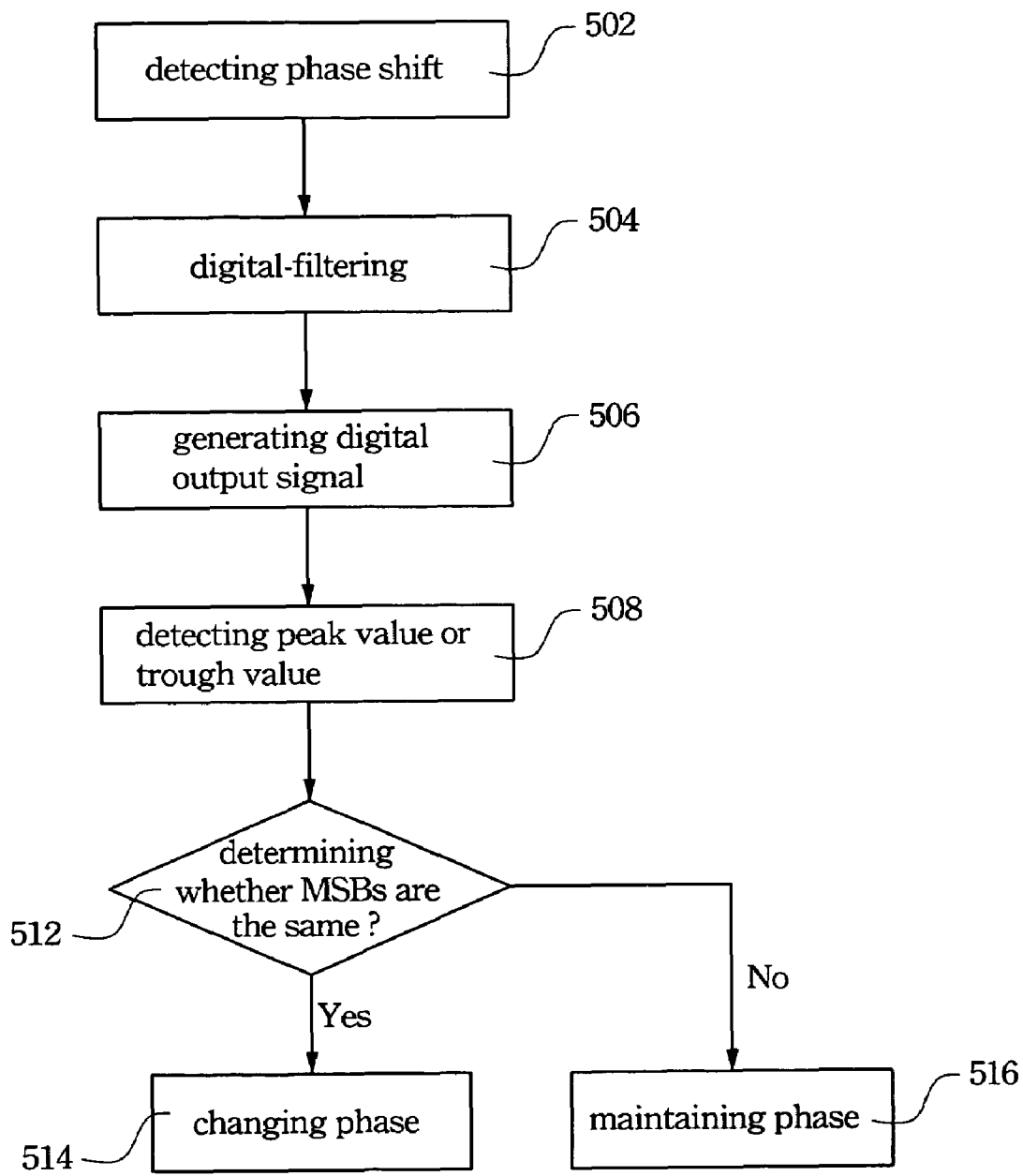
FIG. 5 is a flow chart of one preferred embodiment of the present invention.

FIG. 5 is a flow chart of one preferred embodiment of the present invention. As illustrated in FIG. 5, the TV signal phase-locking method is used for locking phases of a digital input signal and a digital output signal. The digital input signal is a digital sine wave, and the digital output signal is reproduced according to the digital input signal.

A phase shift between the digital output signal and the digital input signal is detected to generate a phase shift signal (step 502). The phase shift signal is digitally filtered to remove unnecessary noise (step 504). Then, the digital output signal is generated according to the filtered phase shift signal (step 506).

When the digital output signal and the digital input signal are of steady states, a peak value or a trough value of the digital output signal is detected (step 508). Whether or not the most significant bit of the peak value or the trough value is identical to the most significant bit of the simultaneously inputted digital input signal is determined (step 512). The phase of the digital input signal is changed when the most significant bit of the peak value or the trough value is different from the most significant bit of the simultaneously inputted digital input signal (step 514); and the phase of the digital input signal is maintained when the most significant bit of the peak value or the trough value is identical to the most significant bit of the simultaneously inputted digital input signal (step 516).

According to one preferred embodiment of the present invention, the method is used for a TV signal decoder, where the digital input signal is a color burst signal, and the digital output signal is a sub-carrier signal. The color burst signal and the sub-carrier signal have the same oscillation period, and each oscillation period has N sampling points. Moreover, the quantity N of the sampling points is determined by an oscillation frequency of the digital input signal and a sampling frequency. When the most significant bit of the peak value or the trough value is different from the most significant bit of the digital input signal simultaneously inputted into the phase delay comparator, the phase delay comparator 312 delays the digital input signal by [N/2] or [N/2]+1 sampling points. The symbol [ ] is a representation of floor function or Gauss function, whose value is obtained by rounding down to the nearest integer; e.g., [3.4] is 3 and [4.6] is 4.

Taking the NTSC television system as an example, whose sampling frequency is 27 MHz, the color burst signal is a digital sine wave of which the oscillation frequency is 3.58 MHz, and the oscillation period of the color burst signal consists of 7 or 8 sampling points. If there are 8 sampling points, each sampling point represents 48 degrees. When the phases of the color burst signal and the peak value or the trough value of the sub-carrier signal are opposite, i.e. the color burst signal and the sub-carrier signal are shifted by 180 degrees, the color burst signal is delayed by 4 sampling points (equivalent to 192 degrees) so as to make the delayed color burst signal and sub-carrier signal have a phase shift of only 12 degrees and further to lock their phase shift at 0 degrees.

Figure 2:
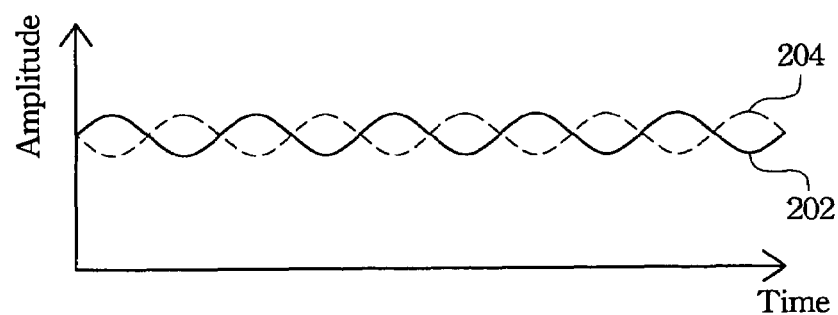
FIG. 2 is a schematic diagram of the opposite phase locking of the color burst signal and the sub-carrier signal.
Figure 6:
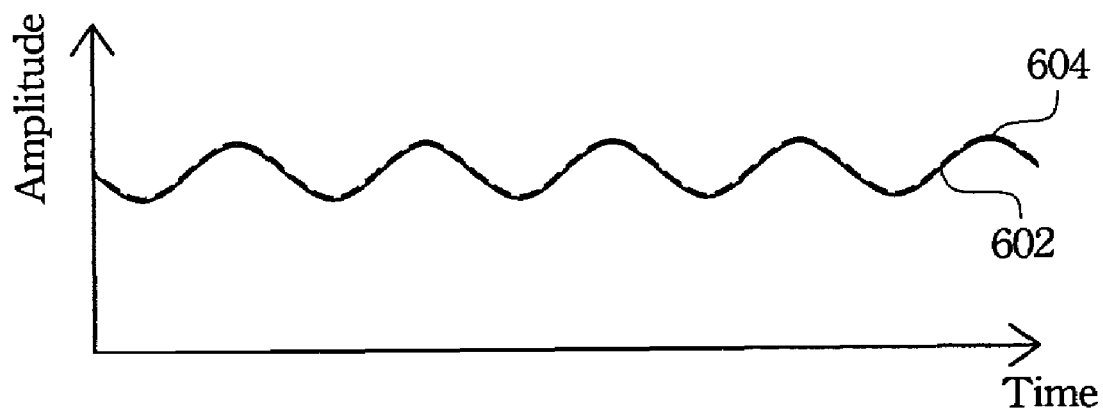
FIG. 6 is a schematic diagram of the locked phases of the color burst signal and the sub-carrier signal in the preferred embodiment.

FIG. 6 is a schematic diagram of the locked phases of the color burst signal and the sub-carrier signal in the preferred embodiment. As illustrated in FIG. 6, the preferred embodiment can lock the color burst signal 202 (solid line) and the sub-carrier signal 204 (dashed line), which are locked at opposite phases in FIG. 2, into the color burst signal 602 (solid line) and the sub-carrier signal 604 (dashed line) of the same phase, for the subsequent color demodulator demodulating the correct colors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital phase-locked loop circuit, comprising:
   a phase detector, arranged to compare phases of a digital input signal and a digital output signal to generate a phase shift signal;
   a loop filter, arranged to digitally filter the phase shift signal;
   a digital control oscillator, arranged to generate the digital output signal according to the filtered phase shift signal;
   a value detector, arranged to detect the digital output signal and output a peak value or a trough value of the digital output signal; and
   a phase delay comparator, arranged to receive the digital input signal and the peak value or the trough value of the digital output value, and determine whether or not the most significant bit of the peak value or the trough value is identical to the most significant bit of the digital input signal simultaneously inputted into the phase delay comparator, the phase delay comparator further comprising:

a most significant bit comparator, arranged to determine whether or not the most significant bit of the peak value or the trough value is identical to the most significant bit of the digital input signal simultaneously inputted into the phase delay comparator;

a delay, arranged to delay the phase of the digital input signal; and a multiplexer, wherein when the most significant bit of the peak value or the trough value is different from the most significant bit of the digital input signal simultaneously inputted into the phase delay comparator, the multiplexer is arranged to selectively output the delayed digital input signal, and when the most significant bit of the peak value or the trough value is identical to the most significant bit of the digital input signal simultaneously inputted into the phase delay comparator, the multiplexer is arranged to selectively output an un-delayed digital input signal;

wherein when the most significant bit of the peak value or the trough value is different from the most significant bit of the digital input signal simultaneously inputted into the phase delay comparator, the phase delay comparator is arranged to change the phase of the digital input signal inputted into the phase detector.

2. The digital phase-locked loop circuit of claim 1, wherein when the most significant bit of the peak value or the trough value is identical to the most significant bit of the digital input signal simultaneously inputted into the phase delay comparator, the phase delay comparator is arranged to maintain the phase of the digital input signal inputted into the phase detector.

3. The digital phase-locked loop circuit of claim 1, wherein the delay comprises a plurality of buffers electrically connected in series.

4. The digital phase-locked loop circuit of claim 1, wherein the digital input signal is a color burst signal, and the digital output signal is a sub-carrier signal.

5. The digital phase-locked loop circuit of claim 1, wherein the digital input signal and the digital output signal have the same oscillation period, and each oscillation period has N sampling points.

6. The digital phase-locked loop circuit of claim 5, wherein the quantity N of the sampling points is determined by an oscillation frequency of the digital input signal and a sampling frequency.

7. The digital phase-locked loop circuit of claim 5, wherein when the most significant bit of the peak value or the trough value is different from the most significant bit of the digital input signal simultaneously inputted into the phase delay comparator, the phase delay comparator is arranged to delay the digital input signal by [N/2] or [N/2]+1 sampling points.

8. A digital phase-locked loop circuit having a phase detector and a digital control oscillator, the phase detector detecting phases of a digital input signal and a digital output signal to generate a phase shift signal, the digital control oscillator generating the digital output signal according to the phase shift signal, the digital phase-locked loop circuit characterized by:

the digital phase-locked loop circuit further comprising a phase" delay comparator and a value detector, the value detector being arranged to detect the digital output signal and output a peak value or a trough value of the digital output signal to the phase delay comparator;

the phase delay comparator being arranged to determine whether or not signs of the peak value or the trough value and the digital input signal simultaneously inputted into the phase delay comparator are identical, the phase delay comparator further comprising:

a sign bit comparator, arranged to determine whether or not the signs of the peak value or the trough value and the digital input signal simultaneously inputted into the phase delay comparator are identical;

a delay, arranged to delay the phase of the digital input signal; and a multiplexer, wherein when the signs of the peak value or the trough value and the digital input signal simultaneously inputted into the phase delay comparator are different, the multiplexer is arranged to selectively output the delayed digital input signal, and when the signs of the peak value or the trough value and the digital input signal simultaneously inputted into the phase delay comparator are identical, the multiplexer is arranged to selectively output an un-delayed digital input signal;

wherein when the signs of the peak value or the trough value and the digital input signal simultaneously inputted into the phase delay comparator are different, the phase delay comparator being arranged to change the phase of the digital input signal inputted into the phase detector, and when the signs of the peak value or the trough value and the digital input signal simultaneously inputted into the phase delay comparator are identical, the phase delay comparator being arranged to maintain the phase of the digital input signal.

9. The digital phase-locked loop circuit of claim 8, wherein the delay comprises a plurality of buffers electrically connected in series.

10. The digital phase-locked loop circuit of claim 8, wherein the digital input signal and the digital output signal have the same oscillation period, and each oscillation period has N sampling points, and when the signs of the peak value or the trough value and the digital input signal simultaneously inputted into the phase delay comparator are different, the phase delay comparator is arranged to delay the digital input signal by [N/2] or [N/2]+1 sampling points.

11. A digital phase-locked loop circuit, comprising:

a phase detector, arranged to compare phases of a digital input signal and a digital output signal to generate a phase shift signal;

a loop filter, arranged to digitally filter the phase shift signal;

a digital control oscillator, arranged to generate the digital output signal according to the filtered phase shift signal;

a value detector, arranged to detect the digital output signal and output a peak value or a trough value of the digital output signal; and a phase delay comparator, arranged to receive the digital input signal and the peak value or the trough value of the digital output value, and determine whether or not the most significant bit of the peak value or the trough value is identical to the most significant bit of the digital input signal simultaneously inputted into the phase delay comparator, the phase delay comparator comprising:

a most significant bit comparator, arranged to determine whether or not the most significant bit of the peak value or the trough value is identical to the most significant bit of the digital input signal simultaneously inputted into the phase delay comparator;

a delay, arranged to delay the phase of the digital input signal; and a multiplexer, wherein when the most significant bit of the peak value or the trough value is identical to the most significant bit of the digital input signal simultaneously inputted into the phase delay comparator, the multiplexer is arranged to selectively output an un-delayed digital input signal; wherein when the most significant bit of the peak value or the trough value is different from the most significant bit of the digital input signal simultaneously inputted into the phase delay comparator, the phase delay comparator is arranged to change the phase of the digital input signal received by the phase delay comparator and to be inputted into the phase detector.

12. The digital phase-locked loop circuit of claim 11, wherein when the most significant bit of the peak value or the trough value is identical to the most significant bit of the digital input signal simultaneously inputted into the phase delay comparator, the phase delay comparator is arranged to maintain the phase of the digital input signal inputted into the phase detector.

* * * * *

UNITED STATES PATENT AND TRADEMARK OFFICE
CERTIFICATE OF CORRECTION

PATENT NO.        : 7,634,037 B2                                   Page 1 of 1
APPLICATION NO.   : 11/179847
DATED             : December 15, 2009
INVENTOR(S)       : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 753 days.

Signed and Sealed this

Ninth Day of November, 2010

David J. Kappos
*Director of the United States Patent and Trademark Office*